(12) United States Patent
Tonti et al.

(10) Patent No.: US 8,724,365 B2
(45) Date of Patent: May 13, 2014

(54) PROGRAMMABLE SEMICONDUCTOR DEVICE

(75) Inventors: William R. Tonti, Essex Junction, VT (US); Wayne S. Berry, Essex Junction, VT (US); John A. Fifield, Underhill, VT (US); William H. Guthrie, Essex Junction, VT (US); Richard S. Kontra, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 13/427,162

(22) Filed: Mar. 22, 2012

(65) Prior Publication Data

US 2012/0178239 A1    Jul. 12, 2012

Related U.S. Application Data

(60) Division of application No. 12/911,379, filed on Oct. 25, 2010, now Pat. No. 8,184,465, which is a division of application No. 10/552,971, filed on Oct. 18, 2006, now Pat. No. 7,872,897, which is a continuation of application No. PCT/US03/13392, filed on Apr. 30, 2003.

(60) Provisional application No. 60/462,568, filed on Apr. 11, 2003.

(51) Int. Cl.
*G11C 17/00* (2006.01)

(52) U.S. Cl.
USPC .... 365/96; 365/225.7; 257/529; 257/E23.149

(58) Field of Classification Search
CPC ........ G11C 17/00; G11C 17/16; G11C 17/18; H01L 23/5252; H01L 52/56; H01L 23/5258

USPC ................ 365/96, 225.7; 257/E23.149, 529; 438/467

See application file for complete search history.

(56) References Cited

U.S. PATENT DOCUMENTS 4,229,502 A   10/1980   Wu et al.
4,309,224 A    1/1982   Shibata
(Continued)

FOREIGN PATENT DOCUMENTS

JP    1169942 A    7/1989
JP    6-13465 A    1/1994
(Continued)

OTHER PUBLICATIONS

Latva, I.D., "Ceramics and Intermetallics" Aeronautical Systems Division Technical Report: ASD TR 61-322 (Jul. 1961) pp. 678-709.

(Continued)

*Primary Examiner* — Son Dinh
*Assistant Examiner* — Uyen B Tran
(74) *Attorney, Agent, or Firm* — Scully, Scott, Murphy & Presser, P.C.; Joseph P. Abate, Esq.

(57) ABSTRACT

A programmable device includes a substrate (10); an insulator (13) on the substrate; an elongated semiconductor material (12) on the insulator, the elongated semiconductor material having first and second ends, and an upper surface S; the first end (12a) is substantially wider than the second end (12b), and a metallic material is disposed on the upper surface; the metallic material being physically migratable along the upper surface responsive to an electrical current I flowable through the semiconductor material and the metallic material.

20 Claims, 15 Drawing Sheets

(56) References Cited

U.S. PATENT DOCUMENTS

| | | |
|---|---|---|
| 5,334,880 A | 8/1994 | Abadeer et al. |
| 5,412,593 A | 5/1995 | Magel et al. |
| 5,465,004 A | 11/1995 | Lim et al. |
| 5,854,510 A | 12/1998 | Sur et al. |
| 5,903,041 A | 5/1999 | La Fleur et al. |
| 6,008,523 A | 12/1999 | Narayan et al. |
| 6,084,796 A | 7/2000 | Kozicki et al. |
| 6,337,507 B1 | 1/2002 | Bohr et al. |
| 6,368,902 B1 | 4/2002 | Kothandaraman et al. |
| 6,418,049 B1 | 7/2002 | Kozicki et al. |
| 6,433,404 B1 | 8/2002 | Iyer et al. |
| 6,617,914 B1 | 9/2003 | Kothandaraman |
| 6,624,499 B2 | 9/2003 | Kothandaraman et al. |
| 6,642,601 B2 | 11/2003 | Marshall et al. |
| 6,661,330 B1 | 12/2003 | Young |
| 6,667,537 B1 | 12/2003 | Koike et al. |
| 6,944,054 B2 | 9/2005 | Rueckes et al. |
| 7,180,102 B2 | 2/2007 | Hui |
| 7,417,300 B2 | 8/2008 | Booth et al. |
| 2003/0094671 A1 | 5/2003 | Stribley et al. |
| 2006/0102982 A1 | 5/2006 | Park et al. |

FOREIGN PATENT DOCUMENTS

| | | |
|---|---|---|
| JP | 10340663 A | 12/1998 |
| JP | 11-195711 A | 7/1999 |
| JP | 2000-91438 A | 3/2000 |
| JP | 2002-57217 A | 2/2002 |
| WO | 03015168 | 2/2003 |

OTHER PUBLICATIONS

International Search Report issued in corresponding International Application No. PCT/US2003/13392 filed on Apr. 30, 2003.

Kothandaraman, C. et al., "Electrically Programmable Fuse (eFUSE) Using Electromigration in Silicides" IEEE Electron Device Letters (2002) pp. 523-525, vol. 23, No. 9.

PROGRAMMABLE SEMICONDUCTOR DEVICE

CROSS REFERENCE TO RELATED APPLICATION

This application is a divisional of U.S. patent application Ser. No. 12/911,379, filed Oct. 25, 2010, which is a divisional of U.S. patent application Ser. No. 10/552,971, filed Oct. 18, 2006, which is a continuation of PCT application serial No. PCT/US03/13392 filed Apr. 30, 2003, which claims priority of provisional application Ser. No. 60/462,568, filed Apr. 11, 2003 the entire content and disclosure of which is incorporated herein by reference.

TECHNICAL FIELD

The present invention relates to programmable semiconductor devices and, more particularly, to such devices usable as semiconductor electronic (E) fuses.

BACKGROUND ART

Semiconductor E-fuses in general are known. See, for example, U.S. Pat. No. 5,334,880, Low Voltage Programmable Storage Element, issued Aug. 2, 1994, by Abadeer et al., which is incorporated herein in its entirety.

However, known semiconductor E-fuses have not proven to be entirely satisfactory. Programming in silicon-based semiconductor devices (e.g., fuses) can result in post collateral damage of the neighboring structures. This result typically forces a fuse pitch, or fuse cavity, set of rules that do not scale well with the technology feature rules from one generation to the next. Thus, fuse density and effectiveness of fuse repair, replacement, or customization are limited. Typically, such damage is caused by particulates from fuse blow. In addition, standard electrical programming of a conductive fuse is to change its resistance, either from an unprogrammed state having a low resistance to a programmed state having a high resistance, or from an unprogrammed state having a high resistance to a programmed state having a low resistance. See, for example, U.S. Pat. No. 5,334,880. Such fuses contain an initial resistance, $R0\pm\Delta R0$, and a programmed resistance, $Rp\pm\Delta Rp$. It is the $\pm\Delta Rp$ that causes fuse read instability because this parameter is statistical in nature. The variations that cause the $R0$ and $Rp$ distributions to approach each other cause practical limitations in interrogating a programmed fuse through a standard CMOS latching circuit. To overcome these limitations, the prior art has included additional fuses as reference elements in order to discriminate between a programmed and unprogrammed fuse. Such practices result in unwanted growth in the fuse bank area.

DISCLOSURE OF INVENTION

The present invention overcomes this and other drawbacks by employing a device or fuse structure of a composite material that migrates during a programming event. The material that migrates (e.g., $WSi_2$) changes state, and does not cause collateral damage during its migration or material reformation, and has a programmed state where $\pm\Delta Rp$ is preferably equal to zero. This allows for individual fuses to discriminate among themselves and to eliminate unwanted reference fuse elements, as well as the circuitry used to bias and compare against the reference fuse elements.

According to the invention, a programmable device includes a substrate (10); an insulator (13) on the substrate; an elongated semiconductor material (12) on the insulator, the elongated semiconductor material having first and second ends, and an upper surface S; the first end (12a) being substantially wider than the second end (12b), and a metallic material (40) on the upper surface, said metallic material being physically migratable along the upper surfaces responsive to an electrical current I flowable through the elongated semiconductor material and the metallic material.

A method of programming a device includes flowing an electrical current I through a device having a semiconductor alloy (40) disposed on a doped semiconductor line (12), for a time period such that a portion of the semiconductor alloy migrates from a first end (12a) of the device to a location L proximate to a second end (12b) of the device.

A method of fabricating a programmed semiconductor device, includes providing a semiconductor substrate (10) having a thermal insulator (13); disposing an elongated semiconductor material (12) on the insulator, the semiconductor material having an upper surface S, a first resistivity, and two ends; disposing a metallic material (40) on the upper surface; the metallic material having a second resistivity much less than the first resistivity of the semiconductor material; flowing an electrical current I through the semiconductor material (12) and the metallic material (40) for a time period such that a portion of the metallic material migrates from one end (12a) of the semiconductor material to the other end (12b) and melts the semiconductor material to form an open circuit (90).

It is a principal object of the present invention to provide a programmable semiconductor device which does not cause collateral damage to adjacent devices or other elements during programming.

It is a further object of the present invention to provide a method of fabricating a programmable semiconductor device, which method is readily compatible with various standard MOS manufacturing processes.

It is an additional object of the present invention to provide a method of programming a programmable semiconductor device which reduces collateral damages to neighboring structures.

Further and still other objects of the present invention will become more readily apparent when the following detailed description is taken in conjunction with the accompanying drawings.

BEST MODE FOR CARRYING OUT THE INVENTION

Figure 1:
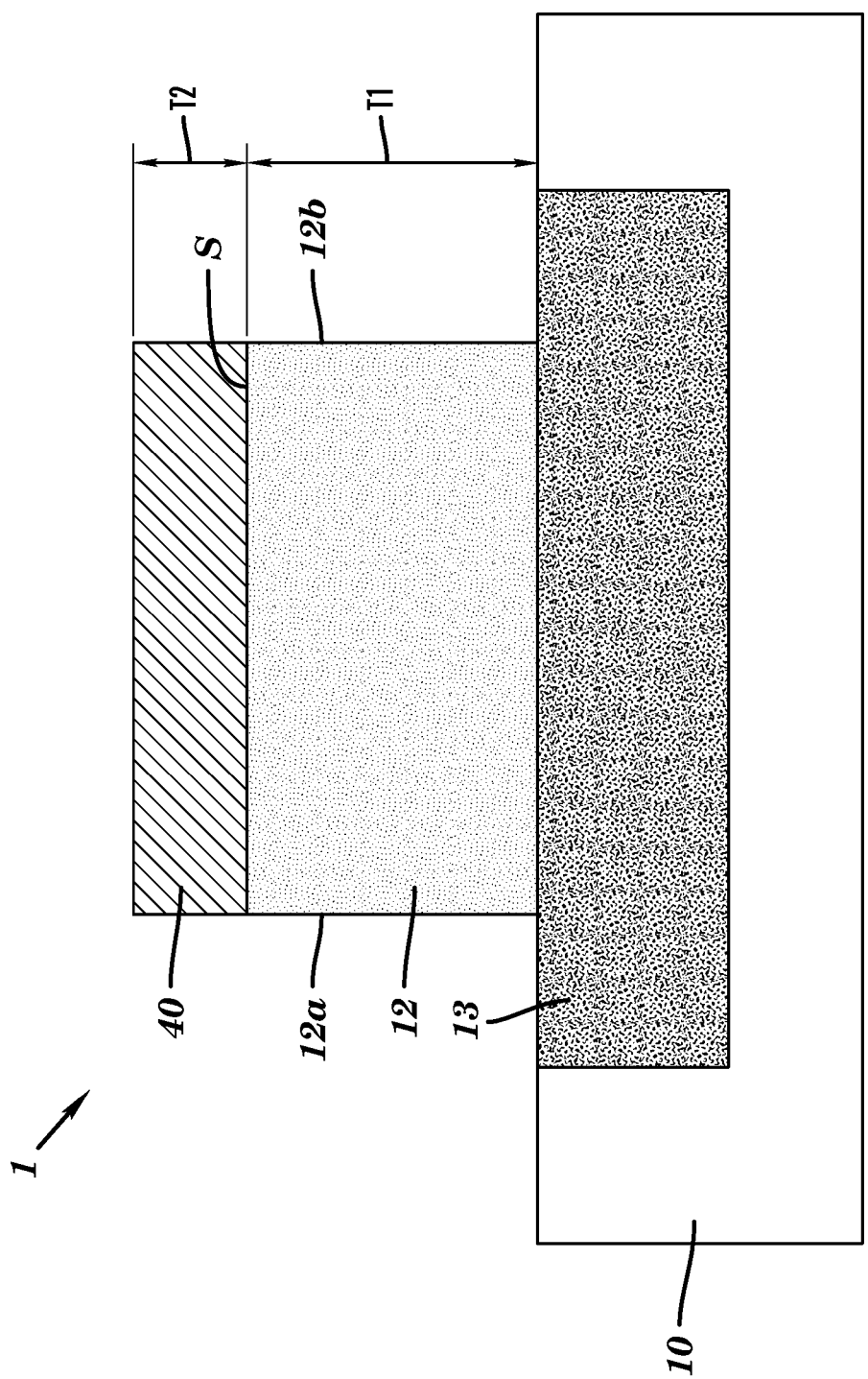
FIG. 1 is a side schematic view of a programmable semiconductor device according to one embodiment of the present invention.
Figure 2:
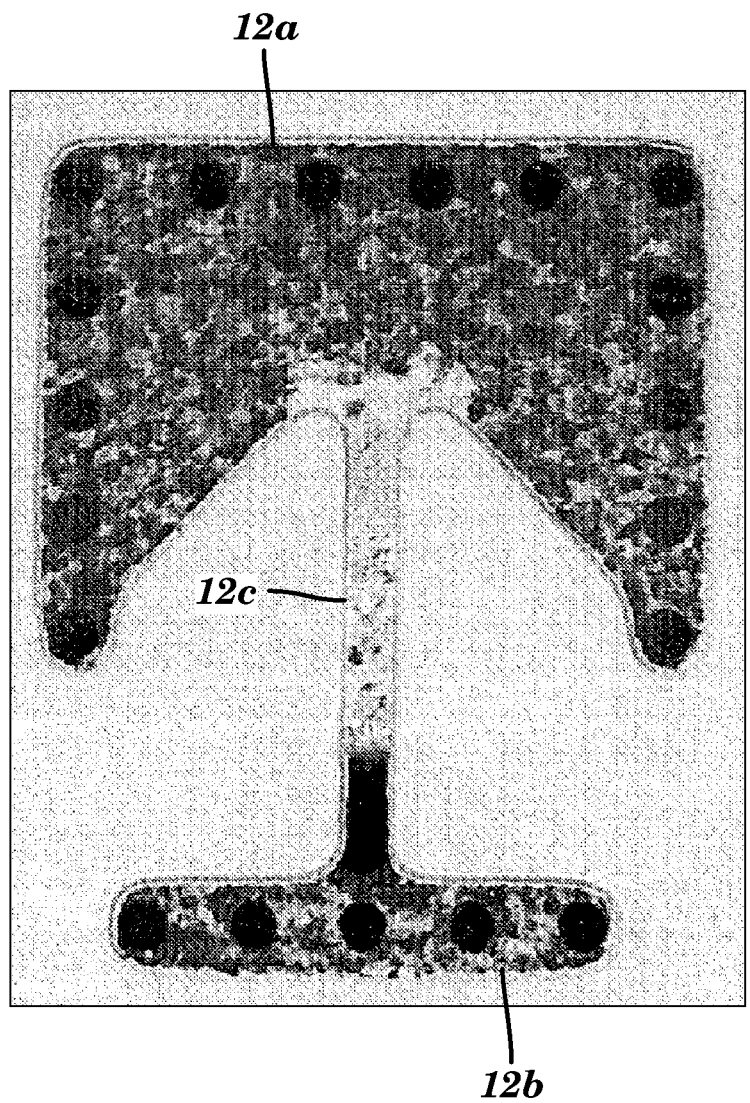
FIGS. 2-4 show top plan view photographs of devices according to the present invention when incompletely programmed (FIG. 2), completely programmed (FIG. 3) and overprogrammed (FIGS. 4a, 4b, 4c).
Figure 11A:
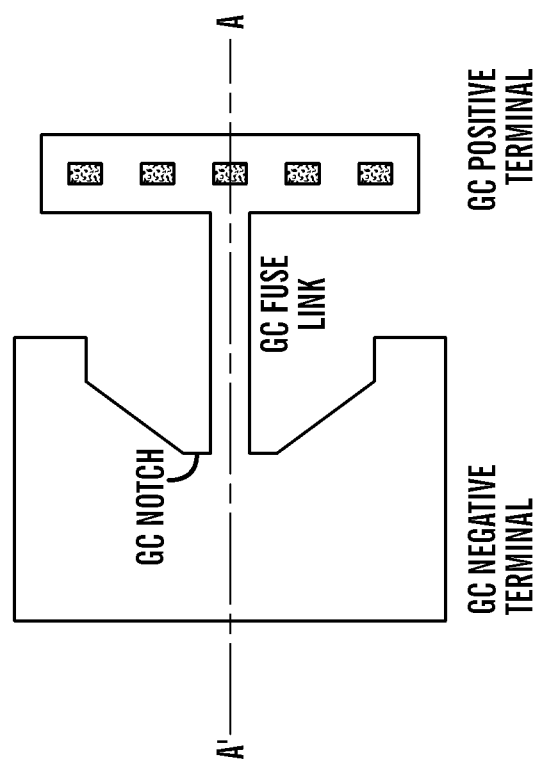
FIG. 11a shows a top plan schematic views of the preferred embodiment of the device (1) according to the invention.
Figure 11B:
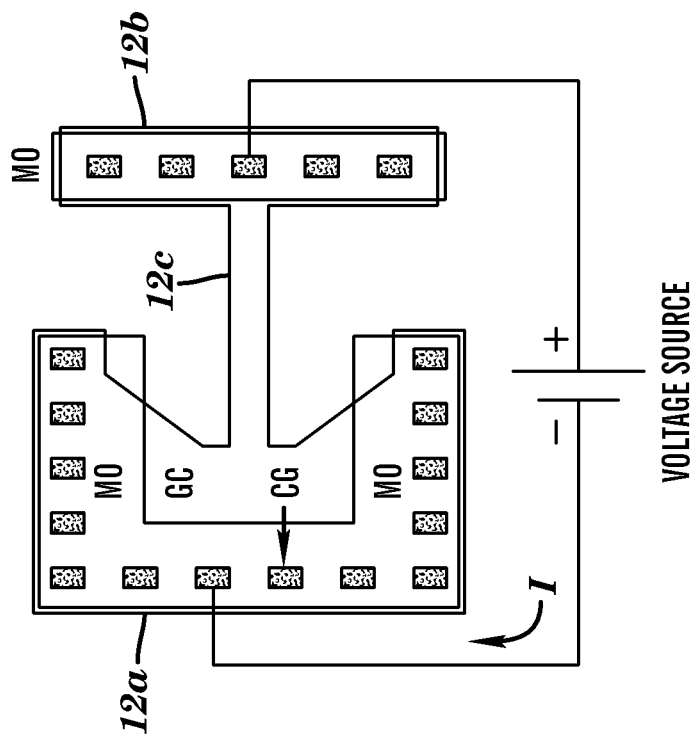
FIG. 11b shows the device (1) connected to an energy source for programming.

FIG. 1 shows a preferred programmable (un-programmed) semiconductor device (1) (e.g. fuse) in cross section. The fuse (1) includes an elongated semiconductor material (12) having a metallic material (40) disposed on an upper surface S. The material (12) is disposed on/over an isolation region (13) in a silicon substrate (10). Preferably, the unprogrammed fuse includes N+ polysilicon (90 nm height/thickness T1) (12) and $WSi_2$ (55 nm height/thickness T2) (40). The region (13) is, for example, filled with an insulator such as an oxide. The region (13) is, for example, a known shallow trench isolation (STI) region. The device (1) includes a first end (12a), a second end (12b) and a central portion or link (12c) connecting the first end (12a) to the second end (12b). Preferably, the link (12c) and the second end (12b), together, form a "T"-shaped member (FIG. 2, and FIGS. 11a, 11b).

According to an important feature of the present invention, the resistivity of the metallic material (40) is much less than the resistivity of the semiconductor line (12). Preferably, the resistivity of the material (40) is in a range of approximately (±10%) 15 ohms per square to approximately 30 ohms per square, while the resistivity of the line (12) is in a range of approximately 100 ohms per square to approximately 200 ohms per square.

Preferably, the resistivity of the material (40) and the line (12) combined is approximately 17 ohms per square to approximately 25 ohms per square.

During programming, i.e., under suitable current, voltage and time conditions, the material (40) migrates from the first end (12a) and the link (12c), to a location "L" proximate to the second end (12b), to accumulate and ultimately heat and melt the semiconductor material (21) at the location "L" to form an open circuit (90) (see FIG. 15) within or at the location "L".

Figure 3:
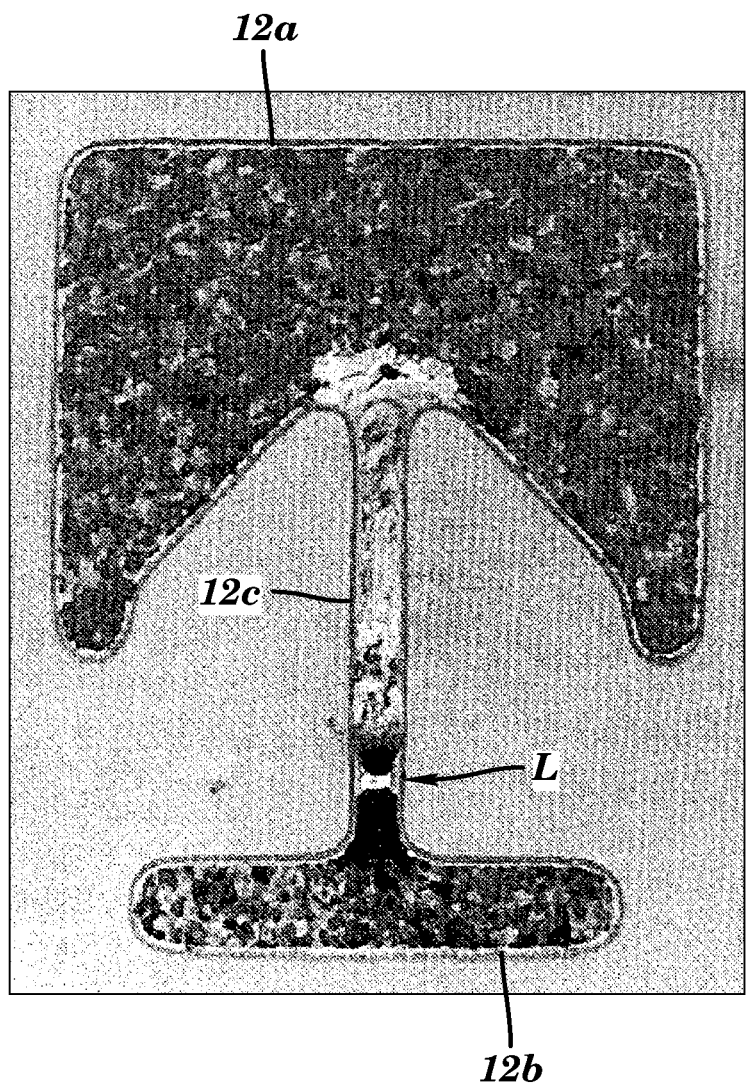
Figure 4C:
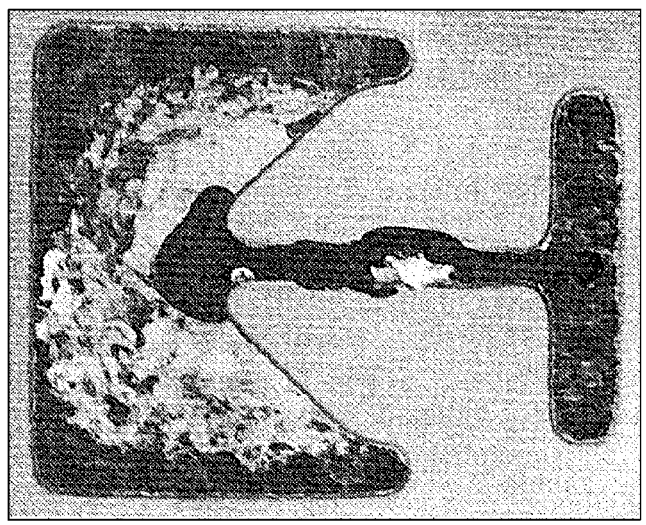
Figure 4B:
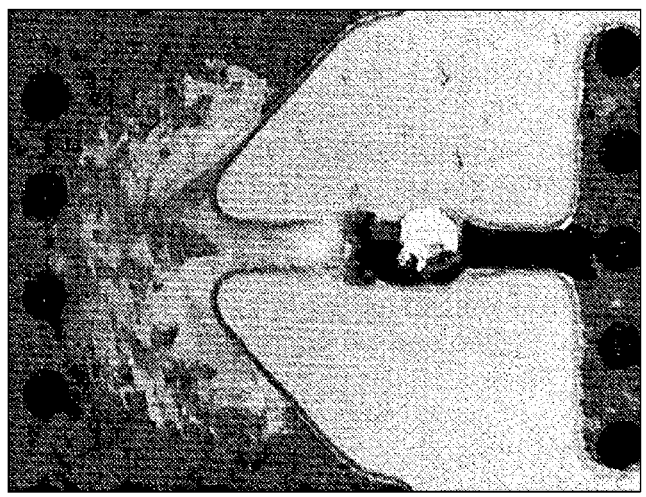
Figure 4A:
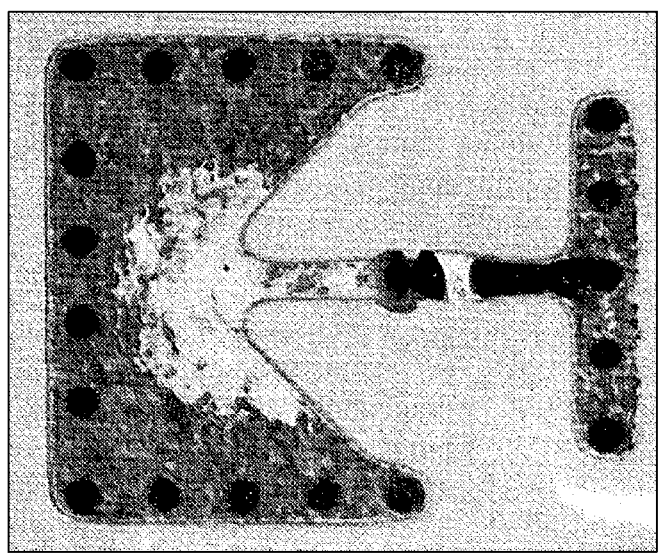

FIGS. 2 through 4 show an initial calibration used in determining the programming current and time required to rule out wafer level process variations when establishing the initial programming conditions. FIG. 2 shows an incomplete programming using 4.5V, 5 mA for 25 μS. FIG. 3 shows a typical preferred complete programming event at 4.5V, 5 mA for 250 μS. An open circuit (90) was formed at a location L proximate to the second end (12b). The programming window was found to be compliant between 150 μS and 350 μS for this given technology. It was further determined that the fuse power and time scale with the technology feature, affording an electrical fuse that is reusable at nano scale technology nodes. FIGS. 4a, b and c indicate various results of overprogramming, and the effect of tungsten available volume.

Figure 6:
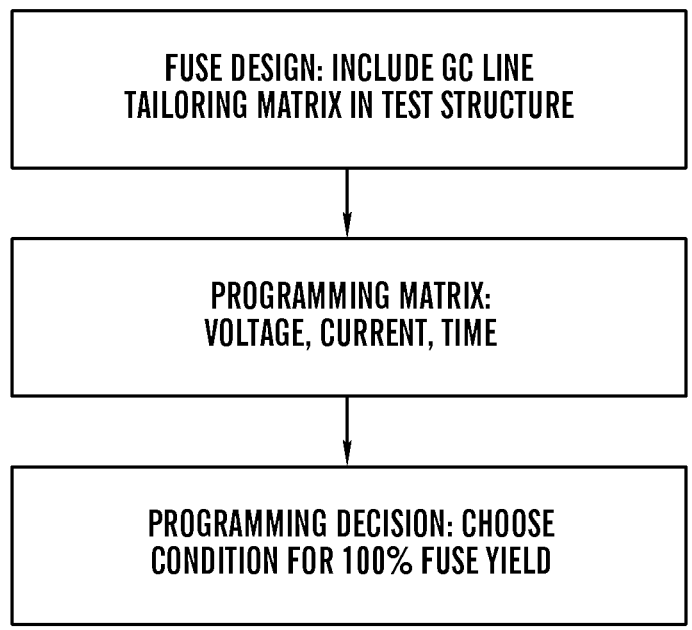
FIG. 6 is a flow diagram of major steps to calibrate parameters for programming a device (1) of the invention.

These FIGS. 4a, b, c show the over programming at 4.7V, 5 mA from 1 mS, 2 S, 4 S. The tungsten silicide (40) continues to migrate until it is depleted. The polysilicon line (12) still melts at the hottest spot, similar to FIG. 3, but in the case of overprogramming the tungsten silicide (40) forms a bridge over the program location, as well as causing stress and damage in the nearby isolation trench. Although the line resistivity has significantly changed due to the migration of the tungsten silicide, and the inventors believe also the dopant, this is not considered a realizable fuse. However, this places a design guideline for a volume of the fuse metallic silicide as compared to a volume of the fuse neck at the programming location to avoid this overprogramming situation. This guideline can be used to size the area of the migrating terminal pad so as to eliminate the condition of excess metallic silicide. These conditions are technology dependent, and can be established at the onset of technology manufacturing. This implies a fuse test and evaluation process flow is an additional feature of this invention. The process flow is self-explanatory and is shown in FIG. 6.

Figure 5A:
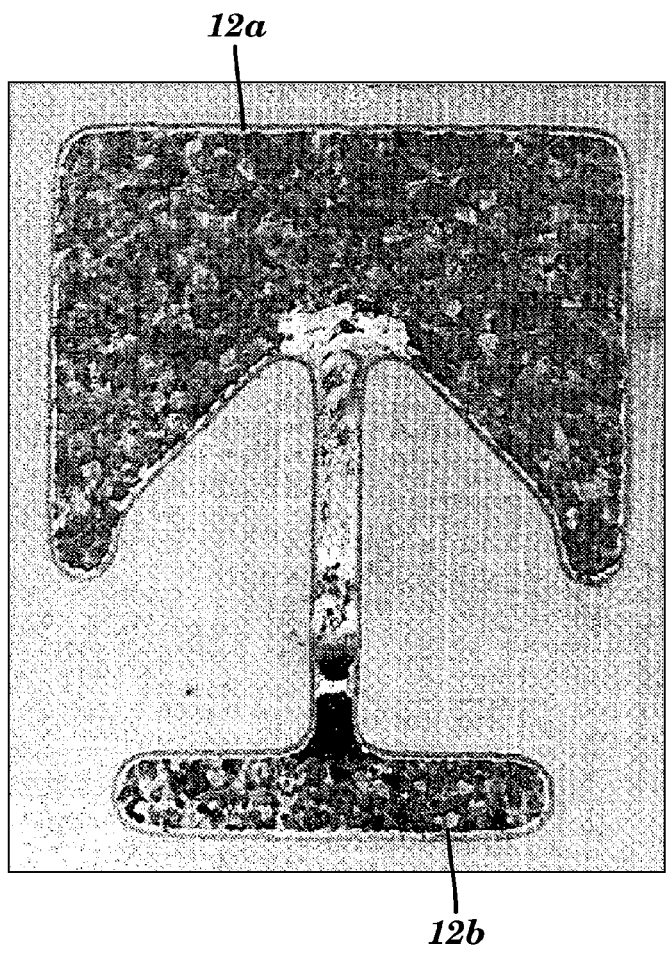
FIG. 5a shows a top plan view photograph and FIG. 5b a side sectional view photograph of a completely programmed device according to the invention.
Figure 5B:
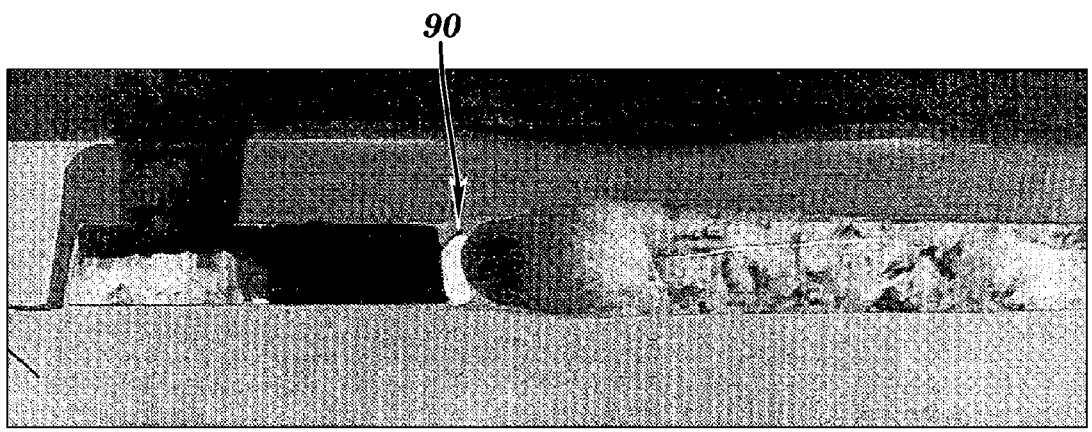
Figure 15:
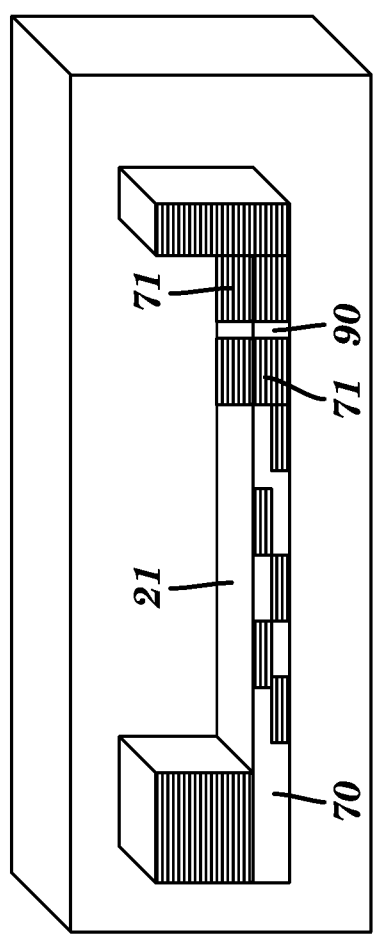

FIGS. 5a and 5b show the result of program calibration on a random E-fuse of the invention. Programming occurs as a three stage event. Initially, as a current I is passed from the cathode to the anode terminals, the $WSi_2$ (40) migrates between the two terminals, and is heated to approximately (±10%) 2160° C. The local heating of the underlying polysilicon line (12 or 21) from the $WSi_2$ (40) and the subsequent opening (90) of the $WSi_2$ shunted path to the N+ polysilicon only path results in the N+ polysilicon line opening (90) as shown in FIG. 5b and FIG. 15. Subsequent analysis of the E-fuse structure indicated the $WSi_2$ as designed transformed into pure W, and all material was conserved. Also, collateral damage is eliminated. The open circuit as shown in FIGS. 5a and 5b provides the correlated feedback required in the calibration programming previously described. It is important to have a shunted N+ polysilicon migratable fuse for two reasons: it allows for low current uniform heating of the entire polysilicon line, without the requirement of large programming devices; and the migration of a hot refractory metal assists in the final link opening and programming, without causing debris surrounding the fuse that might cause subsequent reliability failure.

For the preferred fuse dimensions referenced in FIG. 11a, the optimum fuse programming cycle is: Voltage Source=4.5V, I=5 mA, Time=250 μS±100 μS. The heating of the metallic silicide (40) is approximately (±10%) 2160 degrees C. Under an electron wind, the metallic silicide (40) migrates as depicted in the following FIGS. 12-15), resulting in the final fuse programming, i.e., the opening of polysilicon line (21) as physically shown in FIG. 15. Nothing happens to the surrounding isolation oxide (13). Locations 70, 71 represent the proposed physical model of the redistribution of the metallic silicide (40) while it is heated and migrated by the voltage source (FIG. 11) and current flow I.

GC=polysilicon,
CG=electrical contact to the polysilicon,
M0=metal zero (first metal to pad connections), and
Notch (optional)=notch in polysilicon pad.

FIGS. 7-10 show preferred process steps for fabricating the preferred embodiment of the fuse shown in FIG. 1.

The process of fabricating the fuse of FIG. 1 will be well understood by those skilled in the art in view of the instant disclosure.

Figure 7:
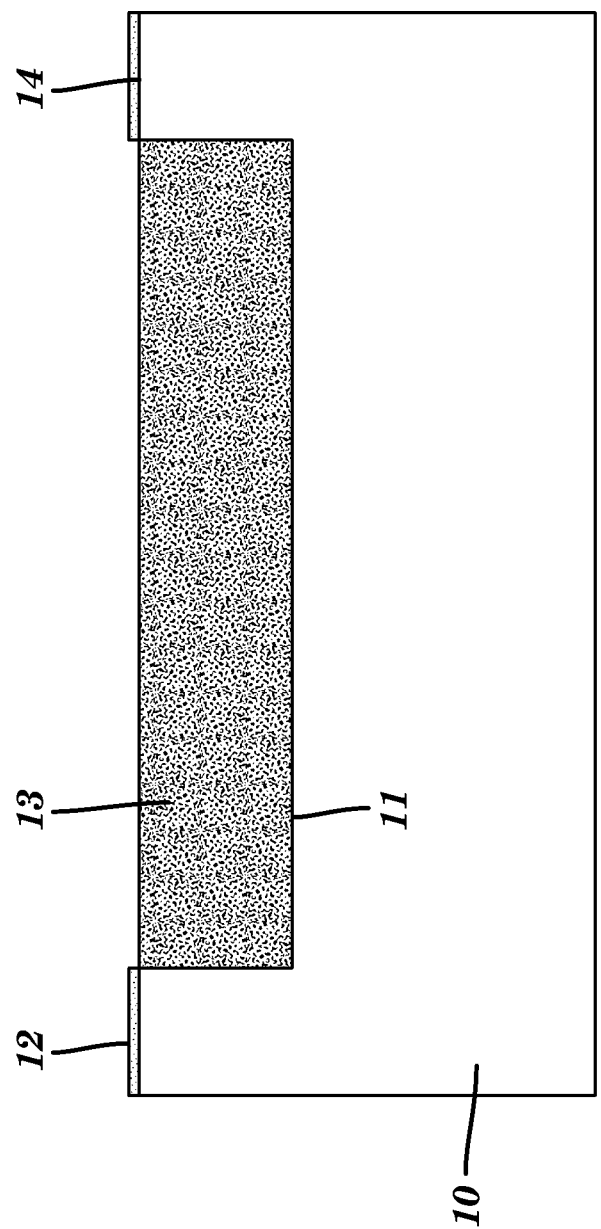
FIGS. 7-10 show preferred salient process steps for fabricating an unprogrammed device according to the invention.

As shown in FIG. 7, provide a substrate (10) which is bulk silicon, silicon-on-insulator or any other suitable substrate. Mask and etch shallow trench isolation region (11) (STI), fill trench (11) with an oxide (13), planarize (e.g., CMP) to a top silicon surface (14), grow gate oxide (12) for proposed active devices D which typically would be formed with the fuse (1). Devices D are, for example, MOS devices such as FETs.

Figure 8:
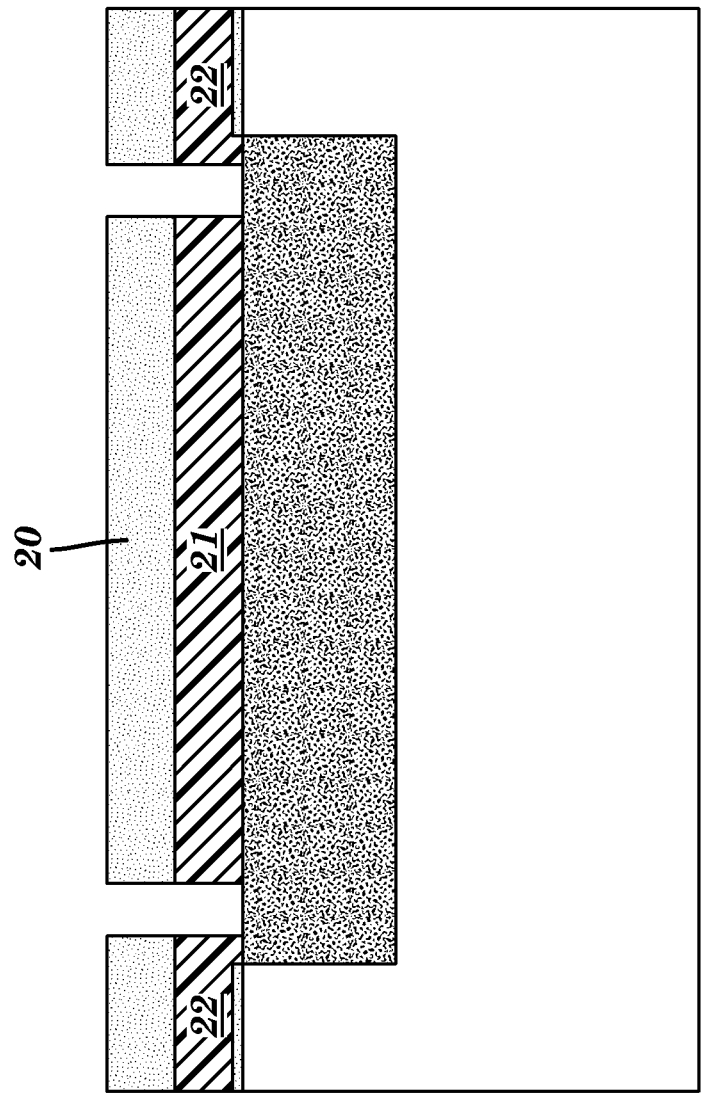

In FIG. 8, dispose (e.g., deposit) polysilicon (22, 21) (doped N or P, or undoped). Pattern with a photoresist mask (20), etch and define active (22) and fuse (21) regions. See, for example, U.S. Pat. Nos. 4,229,502 and 4,309,224, which are incorporated herein by reference in their entireties.

Figure 9:
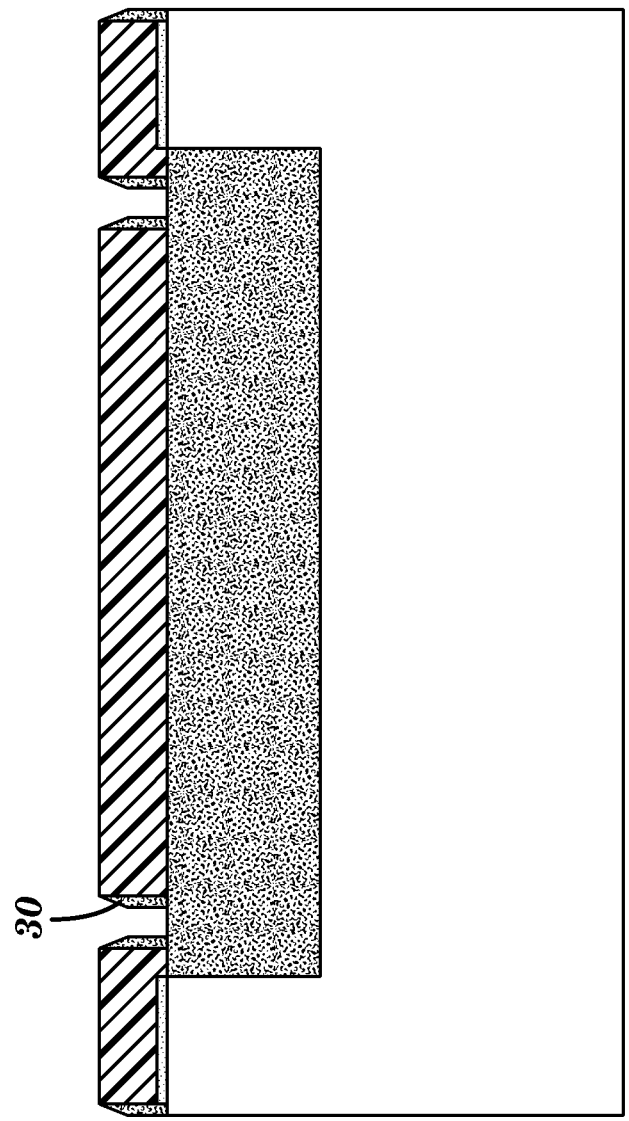

In FIG. 9, form sidewall spacers (30) with a conventional dielectric material.

Figure 10:
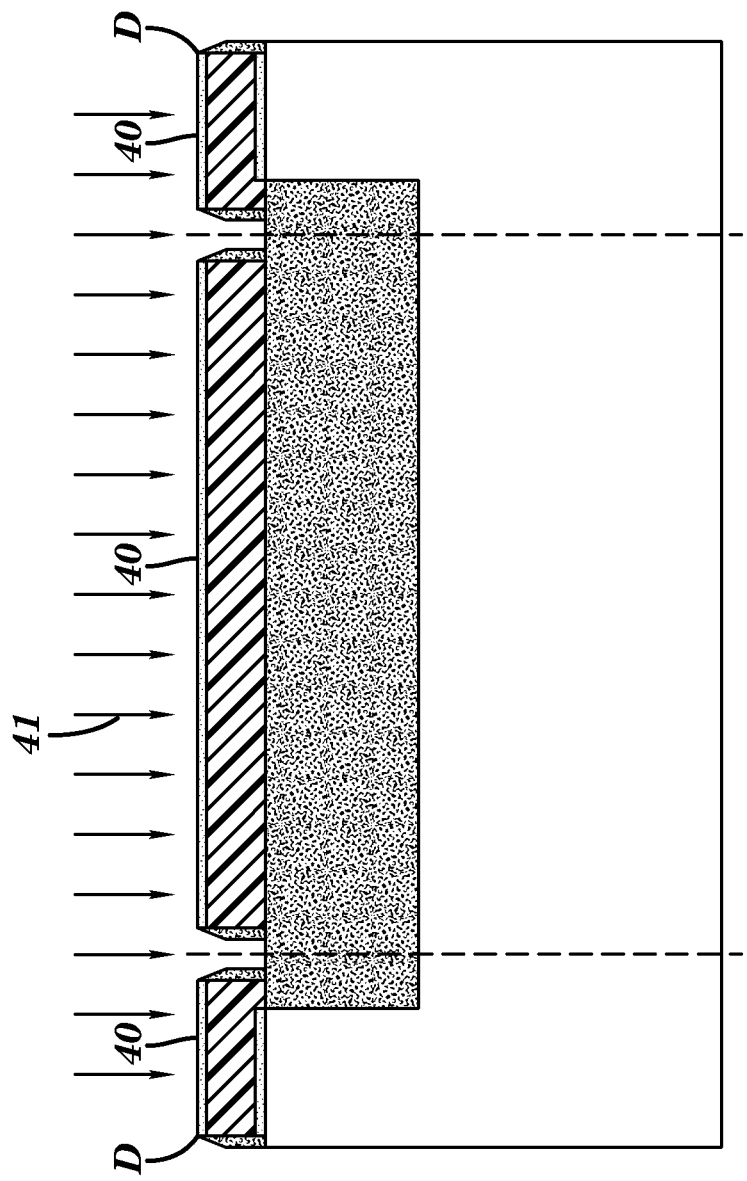

In FIG. 10, suitably implant (41) into proposed FETs D and into the polysilicon (21)—if not in-situ doped polysilicon. Form metallic silicide region (40) by conventional techniques such as deposition (thermal evaporation of $WSi_2$, sputter deposition, etc.). The metallic silicide (40) preferably is $WSi_2$, but can be $CoSi_2$, $TiSi_2$, $NiSi_2$ and others with like electrical and thermal properties. The fuse region is shown between the vertical dashed lines of FIG. 10. Suitable annealing steps can also be performed, and the spacers can be removed. See, for example, the book *VLSI Technology*, by Sze et al., (1988, $2^{nd}$ edition, McGraw Hill) for discussions of various process steps, which book is hereby incorporated by reference.

FIG. 11 shows top views of the fuse, showing the fuse link width equal to 0.196 .mu.m, and a fuse link (central portion) length of 1.862 .mu.m. Of course, fuse link widths can be less than 0.2 μm, i.e., 1 μm and below. It is important that all of the poly (12, 21) sits over the isolation (13), such that a thermal path is directed towards heating the metallic silicide (40) during a programming event. Metallic silicide is migrated from the huge negative terminal source and flows to the positive source via an electron wind. The positive source area must be less than the negative source area to allow the silicide to recrystallize within the underlying poly, and to heat the poly uniformly at the recrystalline point L so as to break (90) the line (12, 21) through heating.

FIGS. 12-15 show top schematic conceptual views useful for understanding the programming process of the present invention. The silicide (40) is driven from the negative terminal and piles up at the positive terminal where the polysilicon is heated and subsequently forms an open circuit, where ΔRp=0. A cross section shows the recrystallization of the silicide near (proximate) the point of programming versus the original "skin" silicide layer (40) over the negative terminal. No damage of the surrounding oxide is evident. It is an important criterion that the resistivity of the metallic silicide (40) be less than that of the underlying polysilicon (12, 21). The materials described as examples meet this criterion.

Any metallic silicide ($NiSi_2$, $CoSi_2$ as examples) will react in the same manner as the tungsten silicide cladding layer we describe; i.e., we can drive a silicide along/down the line and force it to melt/annihilate the polysilicon layer (12, 21) underneath it due to the increased temperature of the "piled" metallic layer (71).

Figure 12:
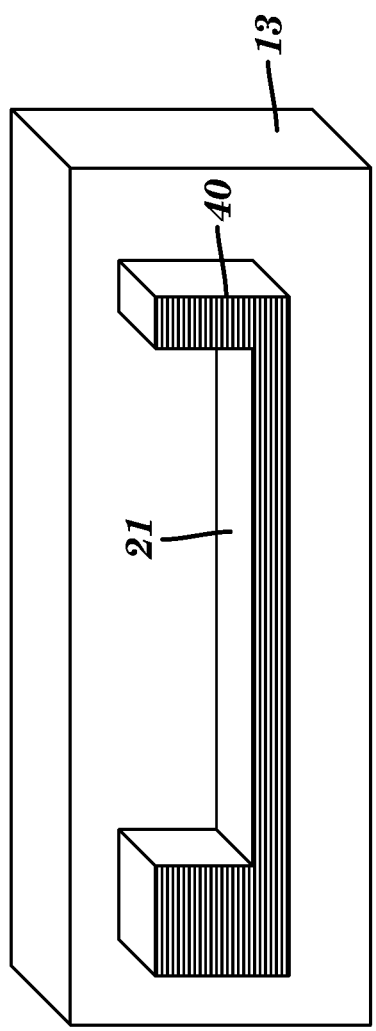
FIGS. 12-15 are top schematic cross-sectional conceptual views into the direction of line AA, but rotated approximately 90° for easier explanation.

FIG. 12 shows a top view in cross section through the fuse prior to programming, showing isolation oxide (13), doped polysilicon (21), and homogeneous silicide layer (40) as formed.

Figure 13:
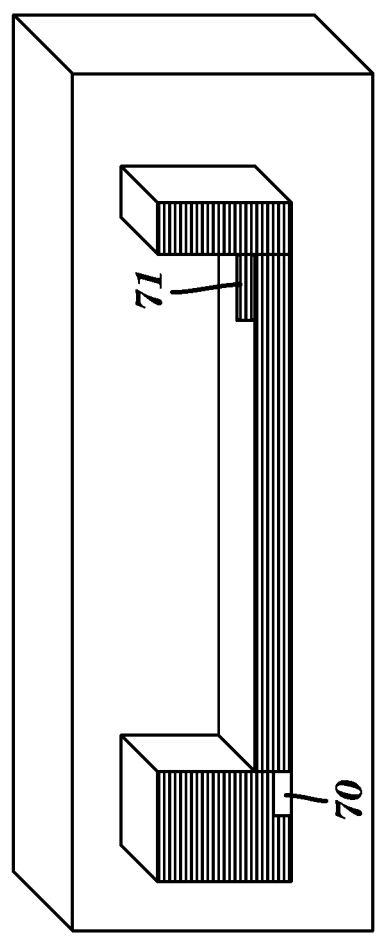

As shown in FIG. 13, during programming, current I is driven through the fuse at a given voltage V. Current conducts primarily through the low resistance silicide layer, and the electron wind produced by the current migrates the silicide (40) towards the end of the link as shown by the absence of the silicide on one end of the line (70) and the buildup of the silicide at the far end of the line (71). The total volume of silicide is conserved within the line. Silicide continues to react with the polysilicon at the end of the line.

Figure 14:
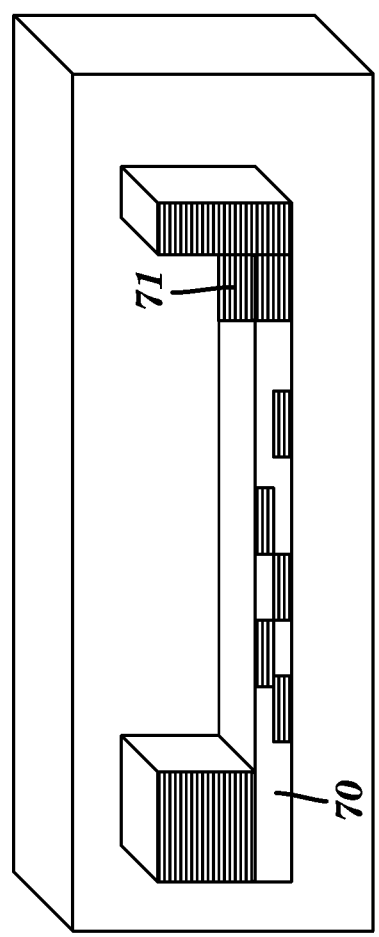

FIG. 14 shows, just prior to final programming, the migrated silicide (71) that consumes the entire end of the polysilicon line where the surrounding polysilicon is heated beyond its respective melting point. Current continues to flow, and silicide continues to migrate.

In FIG. 15, programming is accomplished by removing the applied voltage and current, and the fuse link polysilicon (12, 12c) is pulled back into the migrated silicide (71), forming, in effect, an electrical open circuit (90).

To summarize: a low resistance layer (40) directly in contact, or chemically reacted with, a polysilicon layer (21) under a current I drive cathode to anode is used subsequently to melt a polysilicon line (21) at a location (90) and, thus, form/program a permanent antifuse.

While there has been shown and described what is at present considered a preferred embodiment of the present invention, it will be readily understood by those skilled in the art that various changes and modification may be made therein without departing from the spirit and scope of the present invention which shall be limited only by the scope of the claims.

INDUSTRIAL APPLICABILITY

The present invention has applicability as E-fuses that may be employed during chip production, or within a deployed system to repair failing circuitry, or to customize a hardware or software application.

What is claimed is:

1. A method of programming a programmable semiconductor device, said method comprising:
   providing a programmable semiconductor device employing steps of:
      providing a semiconductor substrate having a thermal insulator,
      disposing a semiconductor material structure on said thermal insulator, said semiconductor material structure has a first resistivity and has an upper surface, a first end portion, and a second end portion, and
      disposing a metallic material structure on said upper surface, said metallic material structure having a second resistivity that is less than said first resistivity; and
   programming said programmable semiconductor device by flowing an electrical current through said semiconductor material structure and said metallic material structure for a time period such that a portion of the metallic material structure migrates from said first end portion to said second end portion and melts a portion of said semiconductor material structure to form an open circuit.

2. The method of claim 1, wherein said first resistivity is approximately equal to 10 times said second resistivity.

3. The method of claim 1, wherein said first resistivity is a substantially uniform resistivity in a range of approximately 100 ohms per square to approximately 200 ohms per square, and wherein said second resistivity is a substantially uniform resistivity in a range of approximately 15 ohms per square to approximately 30 ohms per square.

4. The method of claim 1, wherein a combined resistivity of said semiconductor material structure and said metallic material structure is a substantially uniform resistivity in a range of approximately 17 ohms per square to approximately 20 ohms per square.

5. The method of claim 1, wherein said flowing of said electrical current induces physical migration of said portion of said metallic material structure along said upper surface.

6. The method of claim 1, wherein said semiconductor material structure includes a fuse link between said first end portion and said second end portion, wherein said fuse link laterally contacts said first end portion and said second end portion, and has a pair of parallel sidewalls separated by a substantially uniform width throughout an entirety thereof.

7. The method of claim 6, wherein said first end portion comprises a rectangular portion and a plurality of integral triangular-shaped portions that are integrally attached to said rectangular portion.

8. The method of claim 7, wherein said rectangular portion includes a pair of coplanar sidewalls that are coplanar with each other, contacting sidewalls of said fuse link, and substantially perpendicular to said pair of parallel sidewalls.

9. The method of claim 8, wherein said plurality of integral triangular-shaped portions is laterally spaced from said pair of parallel sidewalls by said pair of coplanar sidewalls.

10. The method of claim 9, wherein sidewalls of said plurality of integral triangular-shaped portions, said pair of coplanar sidewalls, and said pair of parallel sidewalls form openings which face generally toward said second end portion.

11. The method of claim 7, wherein a set of sidewalls of said semiconductor material structure including sidewalls of said plurality of integral triangular-shaped portions and said pair of parallel sidewalls forms openings which face generally toward said second end portion.

12. The method of claim 7, wherein said second end portion is more proximal to said plurality of integral triangular-shaped portions than to said rectangular portion.

13. The method of claim 7, wherein said first end portion comprises at least a plurality of integral triangular-shaped portions having sidewalls, wherein said sidewalls of said plurality of integral triangular-shaped portions and said pair of parallel sidewalls form openings which face generally toward said second end portion.

14. The method of claim 13, wherein said second end portion is more proximal to said plurality of integral triangular-shaped portions than to said rectangular portion.

15. The method of claim 1, wherein said flowing of said electrical current causes heating of said metallic structure.

16. The method of claim 1, wherein said flowing of said electrical current lasts for a time period within a range of approximately 150 $\mu S$ to approximately 350 $\mu S$.

17. The method of claim 1, further comprising providing an energy source connected to said semiconductor material structure configured to cause said flowing of said electrical current.

18. The method of claim 1, wherein said semiconductor material structure comprises a doped polysilicon.

19. The method of claim 1, wherein said metallic material structure comprises a metallic silicide.

20. The method of claim 1, wherein said semiconductor material structure includes a fuse link between said first end portion and said second end portion, and said fuse link and said second end portion form a T-shaped member.

* * * * *